(12) United States Patent
Tchakarov et al.

(10) Patent No.: US 8,427,043 B2
(45) Date of Patent: Apr. 23, 2013

(54) ORGANIC LIGHT-EMITTING DEVICE AND USE OF A TRANSPARENT ELECTROCONDUCTIVE LAYER IN AN ORGANIC LIGHT-EMITTING DEVICE

(75) Inventors: Svetoslav Tchakarov, Arcueil (FR); Didier Jousse, Taverny (FR)

(73) Assignee: Saint-Gobain Glass France, Courbevoie (FR)

( * ) Notice: Subject to any disclaimer, the term of this patent is extended or adjusted under 35 U.S.C. 154(b) by 551 days.

(21) Appl. No.: 12/280,401

(22) PCT Filed: Feb. 21, 2007

(86) PCT No.: PCT/FR2007/050835
§ 371 (c)(1),
(2), (4) Date: Oct. 7, 2008

(87) PCT Pub. No.: WO2007/096565
PCT Pub. Date: Aug. 30, 2007

(65) Prior Publication Data
US 2009/0153026 A1    Jun. 18, 2009

(30) Foreign Application Priority Data

Feb. 22, 2006  (FR) ..................................... 06 01596
Feb. 23, 2006  (FR) ..................................... 06 50622

(51) Int. Cl.
*H01L 51/52*    (2006.01)
(52) U.S. Cl.
USPC .............................. 313/503; 313/504; 313/512

(58) Field of Classification Search ....................... None
See application file for complete search history.

(56) References Cited

U.S. PATENT DOCUMENTS

| | | | |
|---|---|---|---|
| 4,728,581 A | 3/1988 | Kane et al. | |
| 4,732,621 A | 3/1988 | Murata et al. | |
| 4,880,664 A | 11/1989 | O'Dowd et al. | |
| 4,900,370 A * | 2/1990 | Itoga et al. | 257/49 |
| 7,071,617 B2 * | 7/2006 | Utsumi et al. | 313/506 |
| 2002/0113548 A1 * | 8/2002 | Silvernail | 313/506 |
| 2004/0096594 A1 * | 5/2004 | Takeuchi et al. | 428/1.2 |
| 2004/0113146 A1 * | 6/2004 | Dahmani et al. | 257/40 |
| 2006/0108580 A1 * | 5/2006 | Yoshida et al. | 257/40 |
| 2006/0152137 A1 * | 7/2006 | Beteille et al. | 313/503 |

FOREIGN PATENT DOCUMENTS

| | | |
|---|---|---|
| DE | 196 28 119 | 1/1998 |
| EP | 0 234 222 | 9/1987 |
| EP | 0 305 928 | 3/1989 |
| EP | 1 641 054 | 3/2006 |
| WO | 2004 023436 | 3/2004 |
| WO | 2004 034483 | 4/2004 |

* cited by examiner

*Primary Examiner* — Mary Ellen Bowman
(74) *Attorney, Agent, or Firm* — Oblon, Spivak, McClelland, Maier & Neustadt, L.L.P.

(57) ABSTRACT

The present invention relates to an organic light-emitting device including a substrate, a first electrode and a second electrode on one face of the substrate, at least the first electrode being semitransparent or transparent; and an organic electroluminescent layer sandwiched between the first and second electrodes, the first electrode including a diffusing electroconductive layer having a haze of 2% or higher which is on the side where light emitted by the device is output.

31 Claims, 2 Drawing Sheets

ORGANIC LIGHT-EMITTING DEVICE AND USE OF A TRANSPARENT ELECTROCONDUCTIVE LAYER IN AN ORGANIC LIGHT-EMITTING DEVICE

The invention relates to an organic light-emitting device and to the use of a transparent electroconductive layer in such a device.

As is known, organic light-emitting devices comprise:
a transparent substrate;
a first electrode and a second electrode on one and the same face of the substrate, at least the first electrode being transparent; and
an organic electroluminescent layer sandwiched between the first and second electrodes.

To maximize the light emitted by an organic light-emitting device (or OLED, standing for organic light-emitting diode), document EP 1 406 474 proposes to provide the light-emitting device with a diffusing layer in the form of a polymeric matrix comprising scattering particles, this layer being placed beneath or on the transparent electrode.

The object of the invention is to provide an alternative organic light-emitting device that maximizes the emitted light, which is in particular of simpler design and/or less expensive and/or of simpler and/or more rapid manufacture than the known devices.

Figure 1:
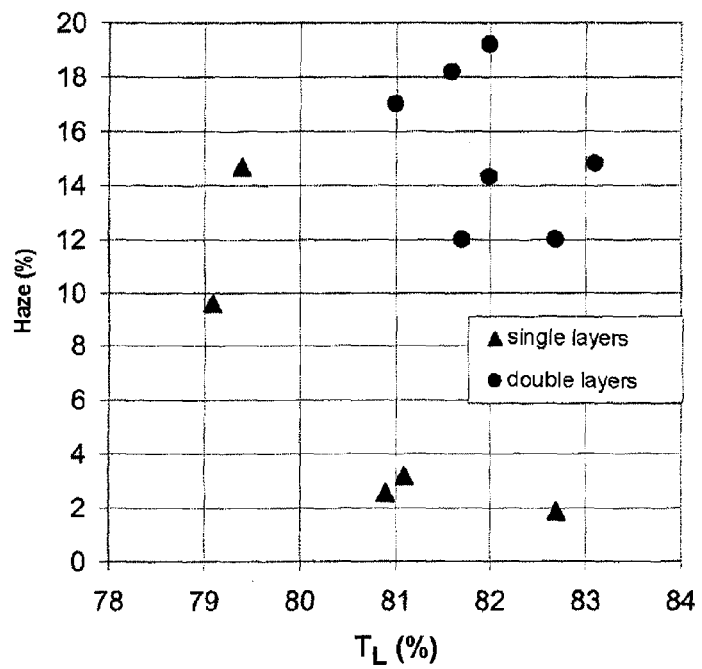
FIGS. 1 and 2 are graphs comparing an $SnO_2$:F monolayer stack structure with a $SnO_2/SnO_2$:F bilayer stack structure.

The first subject of the invention is an organic light-emitting device comprising:
a substrate 10, especially a transparent substrate;
a first electrode 20 and a second electrode 30 on one and the same face of the substrate, at least the first electrode being semitransparent or transparent; and
an organic electroluminescent layer 40 sandwiched between the first and second electrodes,
the first electrode comprising a diffusing electroconductive layer 50 having a haze of 2% or higher.

Against all expectations, a diffusing (semi) transparent electrode makes it possible to improve the extraction efficiency of the organic light-emitting device while still maintaining satisfactory electro-conduction properties.

The organic light-emitting device according to the invention is simple to implement, as it does not require the use of a polymeric diffusing layer.

Within the context of the invention, the term "layer" is understood to mean (in the absence of any further details) either a monolayer or a multilayer or a continuous layer or a discontinuous layer, in particular one having conventional, especially periodic and/or geometric, features of millimeter or centimeter size (these features being obtained either by etching a continuous layer or by directly depositing the discontinuous layer with the desired features, for example using a mask system).

This applies to all the layers involved in the present application. Thus, the diffusing electroconductive layer may be distributed in several diffusing zones, for example with the same level of diffusion.

The first electrode may be the upper electrode, i.e. the electrode furthest from the substrate, or the lower electrode, i.e. the electrode closest to the substrate.

The first electrode may comprise one or more other, diffusing or non-diffusing, electroconductive layers beneath or on top of the diffusing electroconductive layer.

If the two electrodes are transparent, the second electrode may also include an identical or similar diffusing electroconductive layer in order to improve the extraction efficiency.

For applications in which high transparency is desired, for example for illumination through a highly transparent substrate, the electroconductive layer may have a light transmission $T_L$ equal to or greater than 50%, especially 70% or even 80%.

For applications in which transparency is less necessary, the electroconductive layer may be semitransparent, i.e. having a $T_L$ between 5% and 50%.

In preferred embodiments of the invention, one or more of the following arrangements may optionally be furthermore employed:
the haze is preferably between 5% and 20%, in order to further increase the extraction without significantly reducing the transparency if this is necessary for the intended application;
the first electrode possesses a factor formed from the product of the haze (H) multiplied by the light transmission ($T_L$) expressed in a graph of $H(T_L)$ which is above a line defined by the following bi-points: (15,82); (10,84); (6,85);
the first electrode possesses a light absorption×electrical surface resistance product of less than $0.6\Omega/\square$; and
the first electrode has a resistance per square (R) equal to or less than $15\Omega/\square$, especially equal to or less than $12\Omega/\square$ and preferably equal to or less than 10 or 12 $\Omega/\square$.

The diffusing electroconductive layer may be on the side where the light emitted by the device is output, the light emerging either via this single side (the second electrode then being reflective or associated with a reflective element), or on both sides, the second electrode then being transparent or semitransparent and preferably diffusing.

Preferably, the substrate may be transparent, the first electrode is closest to the substrate and preferably the second electrode is diffusing, especially through a roughness induced by the diffusing electroconductive layer of the first electrode.

The diffusion by the electroconductive layer may preferably be obtained with a diffusing surface, i.e. by a surface of appropriate structure. For example, this structure is defined by an appropriate random or quasi-random roughness.

The roughness defined above may be feasibly obtained on an industrial scale by several alternating or cumulative means.

The diffusing electroconductive layer may advantageously be a layer having a diffusing surface directly after deposition.

By thus depositing the layer directly with sufficient roughness, this being more advantageous from the industrial standpoint, an additional, discontinuous treatment step, in the middle of a succession of steps for depositing the various constituent layers of the device is avoided.

The diffusing electroconductive layer may be deposited by various techniques. For example, it may be deposited using a pyrolysis technique, especially in the gas phase (which technique is often abbreviated to CVD (chemical vapor deposition)). This technique is advantageous in the case of the invention since by suitably adjusting the deposition parameters it is possible to obtain a certain roughness.

The diffusing electroconductive layer may advantageously be chosen from metal oxides, especially the following materials: doped tin oxide, especially fluorine-doped tin oxide $SnO_2$:F or antimony-doped tin oxide $SnO_2$:Sb (the precursors than can be used in the case of CVD deposition may be tin halides or organometallics associated with a fluorine precursor of the hydrofluoric acid or trifluoroacetic acid type), doped zinc oxide, especially aluminum-doped zinc oxide ZnO:Al (the precursors that can be used in the case of CVD deposition may be zinc and aluminum halides or organometallics) or gallium-doped zinc oxide ZnO:Ga or doped indium oxide, especially tin-doped indium oxide ITO (the precursors that can be used in the case of CVD deposition may be indium and tin halides or organometallics), or zinc-doped indium oxide (IZO).

It is also possible to deposit the diffusing electroconductive layer by a vacuum deposition technique, especially by evaporation or magnetron sputtering (magnetically enhanced cathode sputtering). The sputtering may be reactive sputtering (starting with metallic or suboxidized targets, in an oxidizing atmosphere) or nonreactive sputtering (starting from ceramic targets, in an inert atmosphere). Here again, modifications to the deposition parameters may allow a certain porosity and/or roughness to be obtained. Thus, it is possible to suitably adjust the pressure in the deposition chamber: a relatively high pressure generally makes it possible to obtain layers that are quite porous and rough on the surface. One possibility consists in modulating this parameter during deposition, so that the electroconductive layer is optionally relatively dense over a certain thickness, and then more porous/rough on the surface. Further parameters, such as the temperature of the process and the mixture of the gases used during the process, may also be varied.

A high temperature, generally above 500° C., for depositing a layer often makes it possible to obtain layers that are at least partly crystallized, capable of generating and/or increasing the roughness of the surface and capable of making the surface diffusing or of increasing the light scattering.

The diffusing electroconductive layer may be rough. Preferably, this roughness is random in the sense that it has no features with a precise geometry. Furthermore, the roughness is dispersed, depending on the size of the surface measured.

The roughness of this diffusing electroconductive layer may also be chosen so that the average size of the features of this roughness is at least 50 nm, measured along the dimension parallel to the surface of the substrate. Advantageously, it is chosen to be at least 100 nm, and preferably at most 500 nm. An average feature size of between 200 and 400 nm is preferred. This average size may be determined in particular by scanning electron microscopy. When the roughness of the layer is in the form of peaks (of irregular shape), which is the case for crystallized layers having a columnar growth, this average size therefore corresponds to the size (largest dimension) of the base of these peaks.

To be diffusing, the diffusing electroconductive layer may also have one or more of the other characteristics described above.

Firstly, the diffusing electroconductive layer may be a layer having a roughness at least partly induced by texturing after deposition, to form a diffusing surface or a more diffusing surface.

This texturing may be carried out chemically, especially by acid etching, by plasma etching, in particular using a suitable mask, for example a random mask, or mechanically, especially by abrasion of the sandblasting type.

In this case, it is possible to use any type of transparent electroconductive layer, for example TCO (transparent conductive oxide) layers, for example with a thickness between 2 and 100 nm. It is also possible to use thin metallic layers called TCCs (transparent conductive coating) for example made of Ag, Al, Pd, Cu or Au, and typically with a thickness between 2 and 50 nm.

Next, the diffusing electroconductive layer may be made of a doped metal oxide which is predominantly, and preferably essentially, crystalline. The crystalline character gives a natural roughness after deposition. To give an example, mention may be made of $SnO_2$:F deposited by CVD.

Finally, the very structure of the diffusing surface of the electrode layer is possibly generated or amplified by an underlayer or underlayers, which may or may not be electroconductive, and/or by the substrate.

Since the electroconductive layer is preferably inorganic, it is preferred to choose one or more inorganic sublayers, preferably obtained by the same deposition technique (for example by PVD or by CVD, especially by evaporation or by magnetron sputtering or by pyrolysis).

Thus, the diffusing electroconductive layer may also have a roughness at least partly induced by the substrate which is textured with features larger in size than 10 nm. The layer is deposited directly or indirectly on this textured substrate. The texturing of the glass substrate is described in document FR283706. The reader may refer in particular to the textured glass coated with an $SnO_2$:F layer described in Example 3 of that document.

The diffusing electroconductive layer may furthermore be deposited, directly or not, on an inorganic layer which is rough directly after deposition with features greater in size than 10 nm and is preferably a sublayer based on tin and oxygen, and optionally on one or more other elements, such as silicon, carbon or nitrogen. A layer based on $Si_ySn_xO$ is for example deposited by CVD and the roughness is promoted by the presence of the tin.

In one particularly advantageous embodiment, since it is simple and rapid to produce, the diffusing electroconductive layer is a multilayer that includes a first electroconductive layer made of an undoped mineral oxide, said first layer being coated with a second electroconductive layer made of the same mineral oxide, said mineral oxide however being doped.

The thickness of the first layer based on an undoped mineral oxide may be between 150 and 900 nm.

Preferably, the doped mineral oxide and/or the undoped mineral oxide are/is deposited at high temperature, especially at a temperature above 600° C., especially by pyrolysis, for example by CVD, in order to form (partially) crystalline oxides.

In this latter embodiment, the first layer may be based on tin oxide ($SnO_2$) and the second layer is based on fluorine-doped tin oxide ($SnO_2$:F), in particular deposited by CVD.

The first electrode may additionally comprise at least one overlayer based on a conductive metal oxide, especially indium oxide doped with tin, with zinc or with molybdenum, or undoped indium oxide, or zinc oxide, this overlayer being deposited on the second layer based on fluorine-doped tin oxide ($SnO_2$:F).

In this latter embodiment, the first layer may also be based on zinc oxide (ZnO) and the second layer is based on aluminum-doped zinc oxide (ZnO:Al).

For example, ZnO:Al is deposited by magnetron sputtering and textured, for example acid-etched, or else it is the ZnO layer that is textured.

Moreover, the device may preferably be provided with at least one barrier layer 60, especially one forming a barrier to alkali metals, which is inserted between said chosen substrate and the electrode closest to the substrate.

This layer possessing alkali-metal-barrier properties may be based on a dielectric chosen from at least one of the following compounds: silicon nitride or oxynitride; aluminum nitride or oxynitride; silicon oxide or oxycarbide, at a thickness of between 20 nm and 150 nm.

The barrier layer may comprise an alternation of layers having a high refractive index, between 1.9 and 2.3, and layers having a low refractive index, between 1.4 and 1.7, especially in $Si_3N_4/SiO_2$ sequences or $Si_3N_4/SiO_2/Si_3N_4$ sequences.

It may be deposited by the same type of technique as the electroconductive layers, for example by pyrolysis (CVD) or by cathode sputtering, in a known manner.

It may also be deposited so that it also has a roughness with features larger in size than 10 nm.

Furthermore, this barrier layer may be on top of or beneath an inorganic layer which is naturally rough after deposition, for example among a sublayer based on silicon, tin and oxygen.

The second electrode layer may be an opaque, reflective, metallic layer comprising in particular an Al, Ag, Cu, Pt or Cr layer obtained by sputtering or evaporation.

OLEDs are generally divided into two large families depending on the organic material used. If the organic electroluminescent layers are polymers, the devices are referred to as PLEDs (polymer light-emitting diodes). If the electroluminescent layers are small molecules, the devices are referred to as SM-OLEDs (small-molecule organic light-emitting diodes).

An example of a PLED consists of the following stack:
a 50 nm layer of poly(2,4-ethylenedioxythiophene) doped with poly(styrene sulfonate) (PEDOT:PSS), and
a 50 nm layer of phenyl poly(p-phenylenevinylene) Ph-PPV.

The upper electrode may be a layer of Ca.

In general, the structure of an SM-OLED consists of a stack of hole-injection layers, a hole-transport layer, an emissive layer and electron-transport layer.

An example of a hole-injection layer is copper phthalocyanine (CuPC), and the hole-transport layer may for example be N,N'-bis(naphthalene-1-yl)-N,N'-bis(phenyl)benzidine (alpha-NPD).

The emissive layer may for example be a layer of 4,4',4"-tri(N-carbazolyl)triphenylamine (TCTA) doped with fac-tris (2-phenylpyridine)iridium $[Ir(ppy)_3]$.

The electron-transport layer may be composed of tris(8-hydroxyquinoline)aluminum $(Alq_3)$ or bathophenanthroline (BPhen).

The upper electrode may be a layer of Mg/Al or LiF/Al.

Examples of organic light-emitting stacks are for example described in document U.S. Pat. No. 6,645,645.

In one particular embodiment, the first electrode is based on a doped and/or undoped mineral oxide deposited at high temperature, preferably by pyrolysis, especially in the gas phase, on the electroluminescent layer, and the second electrode is metallic, for example based on silver or aluminum.

In this configuration, the inorganic layer also acts as barrier to alkali metals.

Moreover, the substrate may be a flat, rigid or flexible substrate, such as a plastic or a metal, and may furthermore form or form part of one of the electrodes. The substrate may preferably be a glass, especially an extra-clear glass.

A soda-lime-silica glass with at least 0.05% FeIII or $Fe_2O_3$ may be chosen, especially the glass Diamant from Saint-Gobain or the glass Albarino from Saint-Gobain.

This substrate may be large, for example having an area of greater than 0.5 or 1 $m^2$.

The device may form part of a multiple glazing unit, especially vacuum glazing or glazing with an air layer or a layer of another gas, or laminated glazing. The device may also be monolithic, comprising monolithic glazing, in order to increase compactness and/or lightness.

The device (especially a panel and/or glazing) may form (alternative or combined choice) an illuminating, decorative, architectural or signaling system or a display panel, for example of the alphanumeric indicia, logos or drawings type placed both on the outside and on the inside.

The device, especially glazing, may be intended for buildings, thus forming an illuminating façade, an illuminating window, glazing intended for a transport vehicle, such as a rear window, a side window or a sunroof of a motor vehicle, or for any other terrestrial, aquatic or airborne vehicle, glazing intended for urban furniture, such as a bus shelter, for a showcase, for a jewelry shelf, for a shop window, a shelf element, for an aquarium or for a greenhouse, or may be intended for interior furnishing, for a mirror, for furniture or for electrically controllable glazing.

The device may also incorporate all functionalizations known in the glazing field, preferably on the nonilluminating face. Functionalizations that may be mentioned include: a hydrophobic/oleophobic layer, a hydrophilic/oleophilic layer, a photocatalytic antisoiling layer, or a stack that reflects thermal radiation (solar control) or infrared radiation (low-E) or antireflection stack.

The invention also relates to the use of a diffusing electroconductive layer as electrode closest to the substrate of an organic light-emitting device, having a haze of 2% or higher.

This diffusing electroconductive layer may be as described above.

Figure 2:
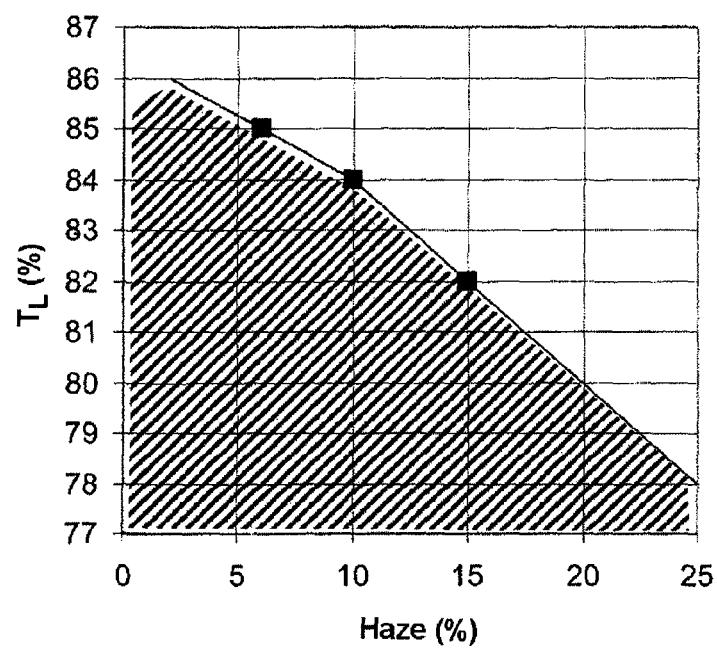
Figure 3:
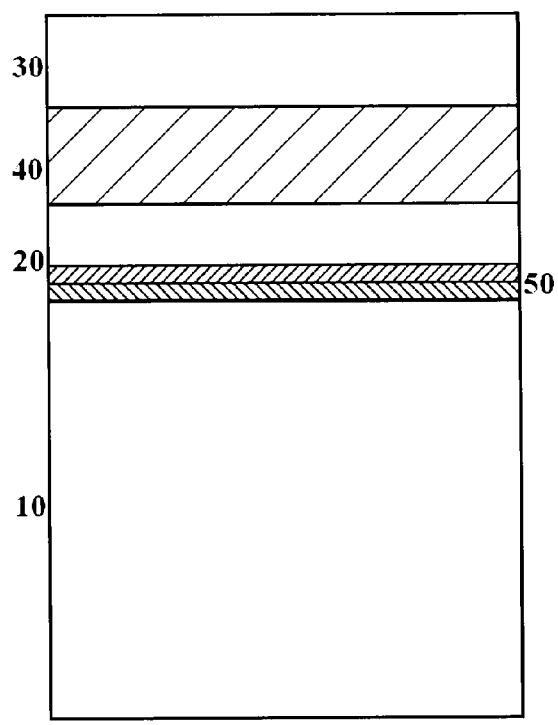
FIG. 3 represents one embodiment of the present invention having a substrate, first electrode, organic electroluminescent layer and second electrode.
Figure 4:
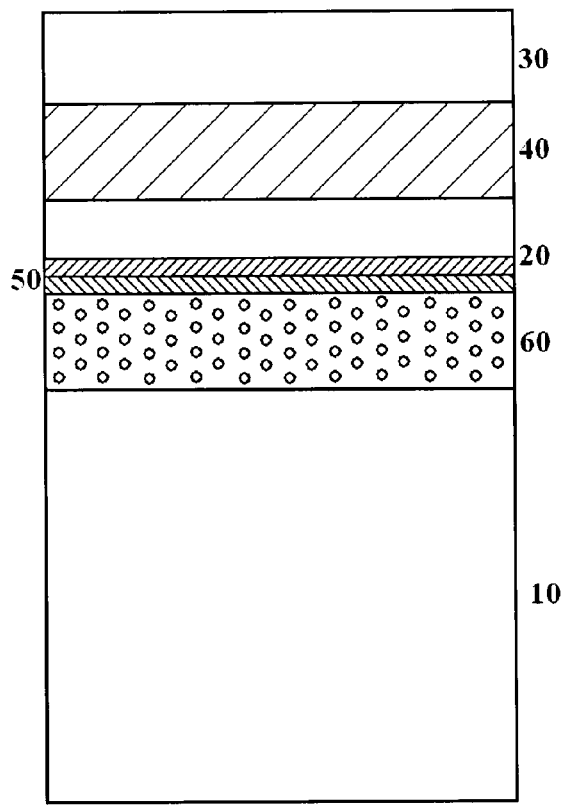
FIG. 4 represents one embodiment of the present invention having a substrate, barrier layer, first electrode, organic electroluminescent layer and second electrode.

The present invention will be better understood on reading the following detailed description of nonlimiting exemplary embodiments and the following figures:

FIGS. 1 and 2 which illustrate points of comparison between an $SnO_2$:F monolayer stack structure on the one hand and an $SnO_2/SnO_2$:F bilayer stack structure on the other hand, forming diffusing transparent electrodes according to the invention for light-emitting devices.

We will firstly describe the structure of the light-emitting devices.

A first organic light-emitting device, for example of OLED type, comprises a transparent substrate, preferably an extra-clear and optionally textured glass, one face of which is coated in this order:
optionally with an alkali-metal-barrier layer, for example a silicon nitride or oxynitride, an aluminum nitride or oxynitride, a silicon oxide or oxycarbide, or else an alternation of layers having a high refractive index, between 1.9 and 2.3, and layers having a low refractive index, between 1.4 and 1.7, especially in $Si_3N_4/SiO_2$ sequences or $Si_3N_4/SiO_2/Si_3N_4$ sequences;
with a first (monolayer or multilayer) transparent electrode that includes a diffusing (monolayer or multilayer) electroconductive layer;
with an organic light-emitting system (OLED) typically formed:
from a layer of alpha-NPB,
from a layer of $TCTA+Ir(ppy)_3$,
from a layer of BPhen or
from a layer of LiF; and
with a second reflective, especially metallic, electrode, preferably in the form of an electroconductive layer, especially one based on silver or aluminum.

The first transparent electrode may or may not comprise other electroconductive layers on top of or beneath the diffusing layer, for example made of ITO, or a thin layer of Ag, ZnO:Al or IZO, for example with a thickness of 50 nm or less.

The second electrode may also be a (semi) transparent and optionally diffusing electrode, for example identical to the first (semi) transparent electrode. In this case, optionally a reflector is attached to the other face, for example a metallic layer 150 nm in thickness and preferably formed from Ag, Al or Au.

This diffusing (monolayer or multilayer) electroconductive layer having a haze of 2% or higher may be chosen to be:
- a doped crystalline oxide monolayer, deposited hot, especially an $SnO_2$:F layer, as described in greater detail layer;
- a TCO layer textured after deposition, for example acid-etched or plasma-etched, for example ITO with a thickness between 60 and 500 nm, or ZnO:Al; or
- a multilayer of the same crystalline mineral oxide, undoped and doped, as described in greater detail later.

As a first variant, this diffusing (monolayer or multilayer) electroconductive layer may have a roughness induced by an inorganic underlayer which is textured or is naturally rough after deposition.

For example, CVD is used to deposit 50 nm of $SnO_2$ followed by 20 nm of $SiO_2$. The process is completed with 700 nm of $SnO_2$:F.

For example, a 100 nm ZnO layer is deposited by magnetron sputtering. The ZnO layer is acid-etched and a 60 nm ITO or IZO layer is deposited on top of it.

Another example consists in depositing an $SiSnO_x$ layer by CVD with a thickness of 100 nm followed by a thin layer of Ag with a thickness between 5 and 20 nm.

As a second variant, this diffusing (monolayer or multilayer) electroconductive layer may have a roughness induced by the barrier underlayer which is textured and/or by the glass which is textured.

For example, an $SiO_2$ layer is deposited by CVD. The $SiO_2$ layer is plasma-etched in order to obtain a rough surface. Next, a TCO layer, such as an $SnO_2$:F, ZnO:Al, ITO or IZO layer, or a thin metal layer is deposited.

A second organic light-emitting device comprises a substrate, preferably a mineral and optionally transparent and/or rough substrate, one face of which is coated in this order:
- optionally with the alkali-metal-barrier layer;
- with a reflective electrode in the form of an electroconductive, especially metallic, layer, preferably based on silver, aluminum, palladium, gold or molybdenum;
- with the organic light-emitting system (OLED); and
- with a transparent (monolayer or multilayer) electrode that includes a diffusing electroconductive layer.

This diffusing (monolayer or multilayer) electroconductive layer having a haze greater than 2% may be chosen to be:
- a layer deposited by cathode sputtering or evaporation and textured after deposition, for example acid-etched or chemically etched, for example ITO or ZnO:Al or IZO, or a thin metallic layer;
- a layer having a roughness induced by the metallic electrode, structured beforehand for example by photolithography and/or by the substrate, which is textured;
- a layer deposited by cathode sputtering, for example a layer of ITO, directly on a textured sublayer, also deposited by cathode sputtering, for example acid-etched ZnO, or by evaporation, such as an aluminum layer textured thereafter; and
- a multilayer of the same crystalline mineral oxide, undoped and doped, deposited by cathode sputtering, at least one of the layers of which is textured, for example ZnO and ZnO:Al.

For these devices, the other face of the chosen glass substrate may include one or more layers providing other functionalities, as described later.

Hereinafter we will detail examples of the manufacture of diffusing electroconductive layers in the form of an undoped then doped tin oxide monolayer or tin (or zinc) oxide multilayer.

Manufacture of Diffusing Electroconductive Layers

A bilayer based on $SnO_2/SnO_2$:F was produced as follows: after having heated a transparent substrate to a temperature above 600° C., a mixture of $(C_nH_{2n+1})_4Sn$, where n=1 to 4, $(CH_3)_2SnH_2$, $(C_4H_9)_3SnH$, $(C_4H_9)_2Sn(COOCH_3)_2$, $SnCl_4$, $(CH_3)_2SnCl_2$ or monobutyltin trichloride (MBTCl) vapor and water vapor, oxygen and nitrogen was decomposed.

Next, the partially coated substrate was again heated and brought into contact with a fluorinated tin compound or with a tin compound and a fluorocompound in order to obtain the $SnO_2$:F second layer.

To deposit the $SnO_2$:F layer, any of the aforementioned tin compounds may be used provided that a fluorine donor is added, namely $CF_3COOH$, HF, $CH_3CH_2F_2$, $CHClF_2$, $CH_3CClF_2$, $CHF_3$, $CF_2Cl_2$, $CF_3Cl$ or $CF_3Br$.

To bring these tin compounds into contact with heated transparent substrates and bring about the oxidation and thermal decomposition, the CVD (chemical vapor deposition) method was used, whereby a vapor of tin compounds and an oxidizing gas were brought into contact with a transparent substrate heated to high temperature, or else the spraying method was used whereby a solution of the tin compound was sprayed onto the transparent substrate at high temperature using a sprayer.

It was preferred to use the CVD method whereby a mixture of the vapor of tin compounds, of oxidizing gas, etc. was brought into contact with the transparent substrate heated to a temperature of 400 to 700° C., preferably in the vicinity of the temperature range between 600° C. and 680° C. Thus, a transparent electroconductive film was deposited that consisted of two layers, i.e. an $SnO_2$ layer then an overlappingly deposited other, $SnO_2$:F, layer.

According to the present invention, the thickness of the $SnO_2/SnO_2$:F two-layer film was preferably from 0.6 to 1.5 microns.

To produce a ZnO/ZnO:Al bilayer, at least one dielectric layer was deposited on the substrate by cathode sputtering, in particular magnetron sputtering and preferably reactive sputtering in the presence of oxygen and/or nitrogen, in a sputtering chamber.

The ZnO layer was obtained from a cathode of a doped metal, i.e. one containing a minor element. To give an illustration, it is common practice to use zinc cathodes containing a minor proportion of another metal, such as aluminum or gallium. The control parameters are the following: P=4.0 kW; I=40 A; U=360 V; gas (Ar)=350 sccm. However, to create the haze in the ZnO/Zno:Al bilayer, it was necessary to texture the first ZnO layer by acid etching.

Detailed below are various properties of diffusing electroconductive layers in the form of an undoped and doped tin or zinc oxide monolayer or tin or zinc oxide multilayer.

Examples of Diffusing Electroconductive Layers

A series of films were deposited using the methodology below on a glass substrate of the "Albarino" and/or "Diamant" type, Diamant and Albarino being registered trade marks of the Applicant of the present patent application for glass substrates of the extra-clear type and of the type possessing surface features respectively.

The first series of films deposited comprises a single $SnO_2$:F layer deposited at high temperature (at least above 600° C.) by CVD, by decomposition of base precursors such as those mentioned above+air+$H_2O$+a fluorocompound.

The $T_L$ and haze (H) measurements were made with a hazemeter. The following series of specimens was obtained:

| Specimen | R ($\Omega/\square$) | $T_L$ (%) | Haze or H (%) | $SnO_2$:F thickness (nm) |
|---|---|---|---|---|
| 1 | 6.1 | 79.4 | 14.7 | 1340 |
| 2 | 9.5 | 82.7 | 1.9 | 580 |
| 3 | 7.8 | 81.1 | 3.2 | 685 |
| 4 | 6.3 | 79.1 | 9.6 | 1050 |
| 5 | 8.0 | 80.9 | 2.6 | 660 |

Next, a series of films of the $SnO_2/SnO_2$:F double-layer type was deposited on a glass substrate of the "Albarino" and/or "Diamant" type under the same operating conditions as above (with respective thicknesses ranging from 25%/75% to 75%/25% for total thicknesses of 750 to 1000 nm) and the following specimens were obtained:

| Specimen | R ($\Omega/\square$) | $T_L$ (%) | Haze or H (%) |
|---|---|---|---|
| 6 | 9.7 | 83.1 | 14.8 |
| 7 | 10.0 | 81.0 | 17.0 |
| 8 | 7.7 | 82.0 | 14.3 |
| 9 | 10.5 | 82.0 | 19.2 |
| 10 | 11.2 | 81.6 | 18.2 |
| 11 | 7.8 | 81.7 | 12.0 |
| 12 | 9.2 | 82.7 | 12.0 |

| Specimen | $SnO_2$ thickness (nm) | $SnO_2$:F thickness (nm) |
|---|---|---|
| 6 | 180 | 530 |
| 7 | 610 | 240 |
| 8 | 170 | 530 |
| 9 | 600 | 340 |
| 10 | 640 | 360 |
| 11 | 180 | 600 |
| 12 | 250 | 510 |

The measurements show that, for all the specimens, particularly good performance (concomitantly higher haze and $T_L$) was obtained with the bilayers. This situation is illustrated by the graph in FIG. 1.

In the case of the second set of specimens, the following mobility, carrier density, haze and $T_L$ values measured by spectrophotometry were obtained, showing that the performance is concomitantly very satisfactory (high mobility, moderate density, high $T_L$, high haze):

| Specimen | Carrier mobility ($cm^2$/V/s) | Carrier density ($10^{20}$ $cm^{-3}$) | $T_L$ (%) | Haze (%) |
|---|---|---|---|---|
| 6 | 37.6 | 2.25 | 85.4 | 15.6 |
| 7 | 40.6 | 1.75 | 84.0 | 18.7 |
| 8 | 39.9 | 2.8 | 84.1 | 16.1 |
| 9 | 38.9 | 1.7 | 84.4 | 20.0 |
| 10 | 36.8 | 1.8 | 84.3 | 18.4 |
| 11 | 36.6 | 2.7 | 83.6 | 15.1 |
| 12 | 33.9 | 2.2 | 85.0 | 13.1 |

In the case of the specimens of the second series of films deposited (specimens 6 to 12), a second criterion expressing the relationship between H or haze and light transmission was defined. As is apparent in FIG. 2, all the specimens are above the curve defined by the bi-points (15,82), (10,84) and (6,85) (the unhatched area).

Given below are other examples, for comparison, showing the influence of doping on the haze value obtained and the influence of the production temperature on the haze (the optical measurements being performed using a hazemeter).

Thus, the first example below shows the difference between an $SnO_2$:F monolayer deposited at a temperature T1 (above 600° C.) and the same layer produced at a temperature T2 at least 30° C. higher than T1.

| Dopant flow rate; 8 kg/h | Temperature | Haze |
|---|---|---|
| $SnO_2$:F | T1 > 600° C. | 0.94 |
| $SnO_2$:F | T2 > T1 + 30° C. | 1.8 |

The haze value is almost double on passing from T1 to T2.

The second example shows the relationship between the dopant flow rate and the haze for a thick layer deposited at high temperature (above 600° C.).

| Dopant flow rate (kg/h) | Haze (%) | $T_L$ (%) |
|---|---|---|
| 0 | 20.8 | 78.5 |
| 1.6 | 13.3 | 77.1 |
| 2 | 12.7 | 76.8 |
| 3 | 8.45 | 75.8 |
| 4 | 7.63 | 75.6 |
| 6 | 6.05 | 74.6 |

It may be seen that the doping reduces the $T_L$. The more the layer is doped, the greater the absorption by the charge carriers.

In the double-layer strategy, the $SnO_2$ sublayer is therefore used to create the optimum conditions for haze. At the same time, the $SnO_2$ sublayer promotes a high light transmission. The $SnO_2$:F overlayer also allows the resistance per square of the TCO to be adjusted.

As a variant, a ZnO overlayer may be subsequently deposited by magnetron sputtering on the $SnO_2/SnO_2$:F bilayer, this overlayer being a protective layer, for protection against attack by a hydrogenated plasma, having a thickness of between 10 and 50 nm and preferably close to 20 nm.

As a result of the present invention it is possible to obtain transparent electroconductive films of low electrical resistance which provide a high light transmission and a high haze value.

Additional Functions

As already mentioned, it may be judicious to functionalize the other face of the substrate (on the side opposite the light-emitting system).

Thus, thin layers were deposited on the surface, intended to give it a particular property, such as for example that consisting in allowing the substrate to remain as clean as possible, whatever the environmental attack, i.e. for the purpose of maintaining the appearance and surface properties over the course of time, and making it possible in particular to space out the cleaning operations, succeeding in progressively removing soiling material progressively being deposited on the surface of the substrate, especially soiling material of organic origin, such as fingerprints or volatile organic compounds present in the atmosphere, or even soiling of the soot or pollution dust type.

Now, it is known that certain semiconductor materials exist based on metal oxides which are capable, under the effect of radiation of suitable wavelength, of initiating radical reactions that cause organic compounds to be oxidized: these materials are in general referred to as photocatalytic or photoreactive materials.

In the field of substrates having a glazing function, it is known to use photocatalytic coatings on a substrate which have a pronounced antisoiling effect and can be manufactured on an industrial scale. These photocatalytic coatings generally comprise at least partly crystallized titanium oxide incorporated into said coating in the form of particles, especially with a size of between a few nanometers (3 or 4 nm) and 100 nm, preferably close to 50 nm in the case of particles essentially crystallized in anatase or anatase/rutile form.

This is because titanium oxide falls within semiconductors which, under the action of light in the visible or ultraviolet range, degrade organic compounds that are deposited on their surface.

Thus, according to a first exemplary embodiment, the coating with a photocatalytic property results from a solution based on $TiO_2$ nanoparticles and a mesoporous silica ($SiO_2$) binder.

According to a second exemplary embodiment, the coating having a photocatalytic property results from a solution based on $TiO_2$ nanoparticles and an unstructured silica ($SiO_2$) binder.

Irrespective of the embodiment of the photocatalytic coating, as regards the titanium oxide particles it is furthermore chosen to use titanium oxide that is at least partly crystallized because it has been shown that this is much more effective in terms of photocatalytic property than amorphous titanium oxide. Preferably, it is crystallized in anatase form, in rutile form or in the form of an anatase/rutile mixture.

The coating is produced so that the crystallized titanium oxide that it contains is in the form of crystallites, i.e. single crystals, having an average size of between 0.5 and 100 nm, preferably from 3 to 60 nm. This is because it is within this size range that titanium oxide appears to have an optimum photocatalytic effect, probably because the crystallites of this size develop a high active surface area.

The coating with a photocatalytic property may also comprise, in addition to titanium oxide, at least one other type of mineral material, especially in the form of an amorphous or partially crystallized oxide, for example silicon oxide (or an oxide mixture), titanium oxide, tin oxide, zirconium oxide or aluminum oxide. This mineral material may also contribute to the photocatalytic effect of the crystallized titanium oxide, by itself having a certain photocatalytic effect, albeit a small one compared with that of the crystallized $TiO_2$, this being the case with amorphous or partially crystallized titanium oxide.

It is also possible to increase the number of charge carriers by doping the titanium oxide crystal lattice, by inserting at least one of the following metallic elements into it: niobium, tantalum, iron, bismuth, cobalt, nickel, copper, ruthenium, cerium, molybdenum.

This doping may also be carried out by doping just the surface of the titanium oxide or of the entire coating, the surface doping carried out by covering at least part of the coating of a layer of oxides or of metal salts, the metal being chosen from iron, copper, ruthenium, cerium, molybdenum, vanadium and bismuth.

Finally, the photocatalytic phenomenon may be enhanced by increasing the yield and/or kinetics of the photocatalytic reactions, by covering the titanium oxide or at least part of the coating that incorporates it with a noble metal in the form of a thin layer of the platinum, rhodium or silver type.

The coating having a photocatalytic property also has an outer surface with a pronounced hydrophilic and/or oleophilic character, especially if the binder is a mineral binder, thereby resulting in two not inconsiderable advantages: a hydrophilic character provides perfect wetting of water that may be deposited on the coating, thus making cleaning easier.

In conjunction with a hydrophilic character, it may also have an oleophilic character, allowing wetting of organic soiling materials which, as in the case of water, then tend to be deposited on the coating in the form of a continuous film, which is less visible than well-localized "stains". What is thus obtained is an "organic antisoiling" effect which operates in two steps: as soon as soiling material is deposited on the coating, it is already barely visible. It then progressively disappears by photocatalytically initiated radical degradation.

The thickness of the coating can vary—it is between a few nanometers and a few microns, typically between 50 nm and 10 µm.

In fact the choice of thickness may depend on various parameters, especially on the intended application of the substrate, or else on the size of the $TiO_2$ crystallites in the coating. The coating may also be chosen to have a more or less smooth surface: a low surface roughness may in fact be advantageous if it allows a greater active photocatalytic area to develop. However, too pronounced a roughness may be prejudicial, by favoring incrustation and accumulation of soiling materials.

According to another variant, the functionality added to the other face of the substrate may consist of an antireflection coating, thus making it possible to maximize the energy conversion yield.

Given below are the preferred ranges of geometric thicknesses and indices of the four layers of the antireflection stack according to the invention, this stack being called A:

$n_1$ and/or $n_3$ are between 2.00 and 2.30, especially between 2.15 and 2.25 and preferably close to 2.20;

$n_2$ and/or $n_4$ are between 1.35 and 1.65;

$e_1$ is between 5 and 50 nm, especially between 10 and 30 nm, or between 15 and 25 nm;

$e_2$ is between 5 and 50 nm, especially equal to or less than 35 nm or equal to or less than 30 nm, being in particular between 10 and 35 nm;

$e_3$ is between 40 and 180 nm and preferably between 45 and 150 nm; and $e_4$ is between 45 and 110 nm and preferably between 70 and 105 nm.

The most appropriate materials for forming the first layer and/or the third layer of the stack A, which is of the antireflection type, those having a high index, are based on a mixed silicon zirconium nitride or on a mixture of these mixed nitrides. As a variant, these high-index layers are based on mixed silicon tantalum nitrides or on a mixture of the latter. All these materials may be optionally doped in order to improve their chemical and/or mechanical and/or electrical resistance properties.

The most appropriate materials for forming the second layer and/or the fourth layer of the stack A, those having a low index, are based on silicon oxide, silicon oxynitride and/or silicon oxycarbide or else based on a mixed silicon aluminum oxide. Such a mixed oxide tends to have better durability, especially chemical durability, than pure $SiO_2$ (an example of this is given in patent EP-791 562). The respective proportions of the two oxides may be adjusted in order to obtain the expected improvement in durability, without excessively increasing the refractive index of the layer.

A preferred embodiment of this antireflection stack is of the substrate/$Si_3N_4$/$SiO_2$/$Si_3N_4$/$SiO_2$ form, it being understood that the choice of the various thicknesses, and in particular in the thicknesses of the third and fourth layers, is optimized so that the light transmission lies within the greatest part of the spectrum (namely in the visible and in the infrared).

It goes without saying that the invention applies in the same way to organic light-emitting systems other than those described in the examples.

The invention claimed is:

1. An organic light-emitting device comprising:
   a substrate;
   a first electrode and a second electrode on one face of the substrate, at least the first electrode being semitransparent or transparent; and
   an organic electroluminescent layer sandwiched between the first and second electrodes, wherein the first electrode comprises a diffusing electroconductive layer having a haze of 2% or higher and the diffusing electroconductive layer is on the side where light emitted by the device is output,
   wherein the diffusing electroconductive layer is a multilayer structure comprising a first electroconductive layer made of an undoped mineral oxide and a second electroconductive layer made of a doped mineral oxide, and
   wherein the surface of the diffusing electroconductive layer is rough, having features larger in size than 50 nm from the surface of the substrate measured along the dimension parallel to the surface of the substrate.

2. The light-emitting device as claimed in claim 1, wherein the haze is between 5% and 20%.

3. The light-emitting device as claimed in claim 1, wherein the first electrode possesses a factor formed from the product of the haze (H) multiplied by the light transmission ($T_L$) expressed in a graph of H($T_L$) which is above a line defined by the following bi-points: (15,82); (10,84); (6,85).

4. The light-emitting device according to claim 1, wherein the first electrode possesses a light absorption x electrical surface resistance product of less than 0.6Ω/□.

5. The light-emitting device as claimed in claim 1, wherein the first electrode has a resistance per square ($R_□$) equal to or less than 15Ω/□.

6. The light-emitting device as claimed in claim 1, wherein the substrate is transparent, the first electrode is closest to the substrate and the second electrode is diffusing through a roughness induced by the diffusing electroconductive layer.

7. The light-emitting device as claimed in claim 1, wherein the diffusing electroconductive layer is made of a predominantly crystalline doped metal oxide.

8. The light-emitting device as claimed in claim 1, wherein the diffusing electroconductive layer is a layer having a diffusing surface directly after deposition.

9. The light-emitting device as claimed in claim 1, wherein the surface of the diffusing electroconductive layer is rough, with features larger in size than 50 nm and smaller in size than 500 from the surface of the substrate measured along the dimension parallel to the surface of the substrate.

10. The light-emitting device as claimed in claim 9, wherein the diffusing electroconductive layer is a layer with a roughness at least partly induced by texturing after deposition.

11. The light-emitting device as claimed in claim 1, wherein the diffusing electroconductive layer has a roughness at least partly induced by the substrate which is textured with features larger in size than 10 nm from the surface of the substrate measured along the dimension parallel to the surface of the substrate.

12. The light-emitting device as claimed in claim 1, wherein the diffusing electroconductive layer is deposited on an inorganic layer which is rough with features greater in size than 10 nm from the surface of the substrate measured along the dimension parallel to the surface of the substrate directly after deposition.

13. The light-emitting device as claimed in claim 1, wherein the diffusing electroconductive layer is a multilayer structure comprising a first electroconductive layer made of an undoped mineral oxide and a second electroconductive layer made of a doped mineral oxide, wherein the mineral oxide of the second electro conductive layer is the same as the mineral oxide of the first electro conductive layer except for being doped.

14. The light-emitting device as claimed in claim 13, wherein the thickness of the first layer is between 150 and 900 nm.

15. The light-emitting device as claimed in claim 13, wherein the doped mineral oxide and/or the undoped mineral oxide are/is deposited at a temperature above 600° C.

16. The light-emitting device as claimed in claim 13, wherein the first layer is made of tin oxide ($SnO_2$) and the second layer is made of fluorine-doped tin oxide ($SnO_2$:F).

17. The light-emitting device as claimed in claim 13, wherein the first electrode additionally comprises at least one overlayer based on a conductive metal oxide, this overlayer being deposited on the second layer made of fluorine-doped tin oxide ($SnO_2$:F).

18. The light-emitting device as claimed in claim 13, wherein the first layer is made of zinc oxide (ZnO) and the second layer is made of aluminum-doped zinc oxide (ZnO:Al).

19. The light-emitting device as claimed in claim 1, wherein it is provided with at least one barrier layer, which is inserted between said glass substrate and the electrode closest to the glass substrate.

20. The light-emitting device as claimed in claim 19, wherein the barrier layer is rough with features larger in size than 10 nm from the surface of the substrate measured along the dimension parallel to the surface of the substrate.

21. The light-emitting device as claimed in claim 19, wherein the barrier layer is made of a dielectric selected from the group consisting of silicon nitride, silicon oxynitride, aluminum nitride, aluminum oxynitride, silicon oxide, and silicon oxycarbide.

22. The light-emitting device as claimed in claim 19, wherein the barrier layer forms part of a multilayer coating for optical purposes, consisting of at least two layers of dielectrics having different refractive indices.

23. The light-emitting device as claimed in claim 1, wherein the first electrode is made of a doped and/or undoped mineral oxide deposited by pyrolysis on the electroluminescent layer, and the second electrode is metallic.

24. The light-emitting device as claimed in claim 1, wherein the substrate is glass.

25. The light-emitting device as claimed in claim 1, wherein one of the faces of the substrate is coated with a stack providing a functionality of the anti-reflection or hydrophobic or photocatalytic or solar control or low emissivity (low-E) type.

26. The light-emitting device as claimed in claim 1, wherein it forms a lighting, decorative, architectural or indicating system or a display panel, is intended for buildings, or is intended for a transport vehicle, or is intended for any other terrestrial, aquatic or airborne vehicle, or is intended for urban furniture, for a showcase, for a jewelry shelf, for a shop window, a shelf element, for an aquarium or for a greenhouse, or is intended for interior furnishing, for a mirror, for furniture or for electrically controllable glazing.

27. The light-emitting device as claimed in claim 1, wherein the substrate is transparent.

28. The light-emitting device as claimed in claim 1, wherein the first electrode has a resistance per square ($R_\square$) equal to or less than $12\Omega/\square$.

29. The light-emitting device as claimed in claim 12, wherein the diffusing electroconductive layer comprises tin and oxygen.

30. The light-emitting device as claimed in claim 17, wherein the overlayer is made of a conductive metal oxide selected from the group consisting of indium oxide doped with tin, indium oxide doped with zinc, indium oxide doped with molybdenum, undoped indium oxide, and zinc oxide.

31. The light-emitting device as claimed in claim 19, wherein the barrier layer has a thickness of between 20 nm and 150 nm.

* * * * *